United States Patent [19]
Gorman et al.

[11] Patent Number: 5,231,399
[45] Date of Patent: Jul. 27, 1993

[54] DIFFERENTIAL QUANTIZER REFERENCE RESISTOR LADDER FOR USE WITH AN ANALOG-TO-DIGITAL CONVERTER

[75] Inventors: Gary M. Gorman, Hermosa Beach; David Ng, Los Angeles, both of Calif.

[73] Assignee: TRW Inc., Redondo Beach, Calif.

[21] Appl. No.: 766,370

[22] Filed: Sep. 27, 1991

[51] Int. Cl.$^5$ ............................................. H03M 1/36
[52] U.S. Cl. ..................................... 341/159; 341/155
[58] Field of Search ................. 341/154, 155, 158, 159

[56] References Cited

U.S. PATENT DOCUMENTS

| | | | |
|---|---|---|---|
| 3,846,786 | 11/1974 | Brown et al. | 341/159 |
| 4,058,806 | 11/1977 | Nadler | 341/159 |
| 4,229,729 | 10/1980 | Devendorf et al. | 341/159 |
| 4,578,715 | 3/1986 | Yamaguchi | 358/283 |
| 4,602,241 | 7/1986 | Dingwall | 341/133 |
| 4,719,447 | 1/1988 | Garuts | 341/159 |
| 4,745,393 | 5/1988 | Tsukada et al. | 341/136 |
| 4,752,766 | 6/1988 | Shimizu et al. | 341/159 |
| 4,763,106 | 8/1988 | Gulczynski | 341/141 |
| 4,768,016 | 8/1988 | Chu et al. | 341/159 |
| 4,774,498 | 9/1988 | Traa | 341/159 |
| 4,774,579 | 9/1988 | Kucheran et al. | 358/160 |
| 4,804,960 | 2/1989 | Fernandes et al. | 341/158 |
| 4,814,767 | 3/1989 | Fernandes et al. | 341/158 |
| 4,831,379 | 5/1989 | van de Plassche | 341/159 |
| 4,897,656 | 1/1990 | van de Plassche et al. | 341/159 |
| 4,912,469 | 3/1990 | van de Grift et al. | 341/155 |
| 5,111,205 | 5/1992 | Morlon | 341/154 X |

Primary Examiner—Howard L. Williams
Attorney, Agent, or Firm—G. Gregory Schivley

[57] ABSTRACT

An analog-to-digital converter employing a reference resistor ladder is disclosed for quantizing a differential analog input signal into quantization levels and converting each level into binary output code and requiring comparators having only two inputs. The converter receives positive and negative portions of a differential analog input signal. A first resistive network having a plurality of resistors of equal resistance spreads the negative input portion of the signal to thereby provide a plurality of comparison signals. A second resistive network, likewise having a plurality of resistors of equal resistance being coupled in series spreads the positive input portion of the signal to thereby provide a second plurality of comparison signals. A plurality of two-input comparators are provided to compare the comparison signals provided by the first resistive network with the comparison signals of the second resistive network. The comparator outputs are then encoded to thereby provide an N-bit binary output code response.

19 Claims, 1 Drawing Sheet

$$\text{DATA OUT} = \begin{cases} 1 & \text{IF } \{[(+\text{ANALOG})-(+\text{REF})]+[(-\text{REF})-(-\text{ANALOG})]\}>0 \\ 0 & \text{OTHERWISE} \end{cases}$$

DIFFERENTIAL QUANTIZER REFERENCE RESISTOR LADDER FOR USE WITH AN ANALOG-TO-DIGITAL CONVERTER

BACKGROUND OF THE INVENTION

1. Technical Field

This invention relates to analog-to-digital converters for converting an analog input signal to a plurality of digital signals and, more particularly, to a reference resistor network for converters employing a differential analog input signal.

2. Discussion

Analog-to-digital converters are used in a wide variety of applications for converting an analog signal to a plurality of digital signals. A typical converter may utilize flash quantizer comparator banks for quantizing the analog input signal. It is sometimes preferable to employ a differential signal path to improve system performance. Generally, a differential analog signal path implementation requires comparators each having four inputs. These inputs include positive and negative reference inputs and positive and negative signal inputs.

It is desirable to obtain an analog-to-digital converter for receiving a differential analog signal which requires comparators having only two inputs; the desired comparator inputs being the positive and negative signal inputs of the differential analog signal.

SUMMARY OF THE INVENTION

In accordance with the preferred embodiment of the present invention, a differential resistive spreading network is employed to spread the differential analog input signal amongst the flash quantizer comparator banks of an analog-to-digital converter. The invention advantageously utilizes two equal and independent resistor ladders which spread the positive and negative inputs of the analog differential input signal. Each resistor ladder has a plurality of serially connected resistors of equal value and further includes a reference current source for maintaining a uniform current therein. The converter comparators compare signals tapped from both resistor ladders. The comparators are then triggered in an incremental manner as the analog differential signal changes. As a result, the comparators in the quantizer comparator banks require only two input signals instead of four, thereby easing the comparator design.

BRIEF DESCRIPTION OF THE DRAWINGS

The various advantages of the present invention will become apparent to those skilled in the art by reading the following specification and by reference to the drawings in which.

DETAILED DESCRIPTION OF THE PREFERRED EMBODIMENT

Figure 1:
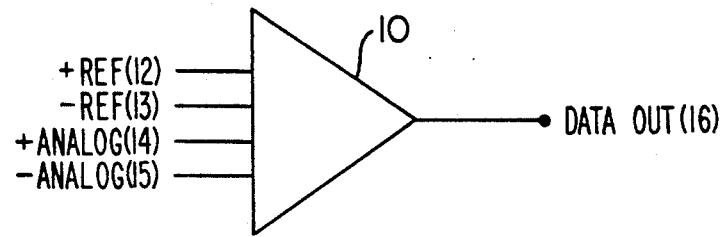
FIG. 1 is a block diagram which illustrates a typical four-input comparator as used in the prior art.

Turning now to FIG. 1, a typical four-input comparator 10 for a differential quantizer is illustrated therein. Generally, the differential analog signal path implementation usually requires that comparators of this sort having four inputs be employed. In all, such a comparator requires both positive and negative reference inputs 12 and 13 and positive and negative signal inputs 14 and 15.

Figure 2:
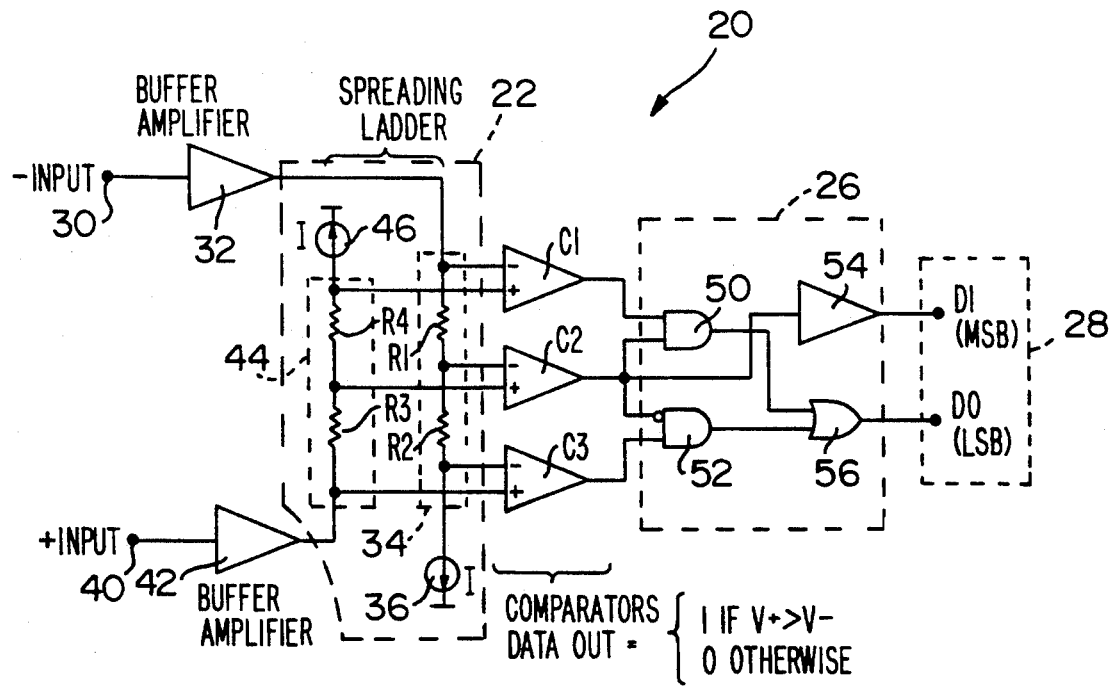
FIG. 2 is a circuit diagram which illustrates the differential resistive spreading ladder in accordance with the present invention for a two-bit flash quantizer example.

FIG. 2 illustrates the technique of the present invention, which provides a differential reference resistor network 22 for a two-bit flash quantizer example. The reference resistor network 22 spreads a differential analog input signal in such a manner that requires comparators C1, C2, and C3 having only two inputs. The circuit configuration 20 is adapted to receive a differential analog signal and convert the signal to a digital output code. In general, the circuit includes positive and negative input terminals 30 and 40, buffer amplifiers 32 and 42, a resistive spreading network 22, a plurality of comparators C1, C2, and C3 and a binary encoder 26 for encoding and providing an N-bit binary output code 28.

The differential analog input signal includes both positive and negative signal portions. As such, separate input terminals 30 and 40 are provided to receive the differential analog signal. The negative input terminal 30 is connected to a first buffer amplifier 32 and is adapted to receive the negative portion of the differential input signal. Connected to the output of the first buffer amplifier 32 is a first resistive spreading ladder 34 which includes two resistors R1 and R2 of equal value for spreading the differential analog input signal and providing a first series of comparison signals therein. Coupled to the output of the first resistive ladder 34 is a reference current source 36 for maintaining a steady uniform current. A level shifted replica of the negative portion of the analog signal is generated at each node of the first resistive spreading ladder 34. The amount of level shift is equal to the sum of the voltages developed across the resistors R1 and R2 by the reference current source 34 at that node.

The positive input terminal 40 being adapted to receive the positive portion of the differential analog input signal is connected to a second buffer amplifier 42. The output of the second buffer amplifier 42 is connected to a second resistive spreading ladder 44. Second resistive spreading ladder 44 likewise, employs two resistors R3 and R4 of equal value being connected in series and adapted for spreading the differential analog input signal and providing a second series of comparison signals. Similarly, a reference current source 46 is coupled to the output of the second resistive ladder 44. A level shifted replica of the positive portion of the analog signal is generated at each node of the second resistive spreading ladder 44. Again, the amount of level shift is equal to the sum of the voltages developed across the resistors R3 and R4 by the reference current source 46 at that node.

Comparators C1, C2, and C3 are coupled to the first and second resistive spreading ladders 34 and 44 for comparing the differential comparison signals of the positive and negative portions of the differential analog signal and providing an output response therefrom. The comparators C1, C2, and C3 are adapted to receive comparison signals provided from the positive portion of the input signal at the positive terminal of each comparator. Likewise, comparison signals provided from the negative portion of the input signal are received by the negative terminal of each comparator and thereby form the comparator threshold. In response, each comparator produces a high output when the positive portion of the differential signal exceeds the comparator threshold. Alternately, a low output response is provided when the positive signal is less than the comparator threshold.

The negative terminal of comparator C1 is adapted to receive a comparison signal from the negative portion of the differential signal before it is applied to resistors R1 and R2 of the first resistor spreading ladder 34. The positive terminal of comparator C1 is adapted to receive a comparison signal from the positive portion of the differential signal after the signal has been applied to both resistors R3 and R4 of the second resistive spreading ladder 44.

The negative terminal of comparator C2 is adapted to receive a comparison signal from the negative portion of the differential signal between resistors R1 and R2, after having been partially level shifted by the first resistor R1 of the first resistive spreading ladder 34. Similarly, the positive terminal of comparator C2 is adapted to receive a comparison signal from the positive portion of the differential signal between resistors R3 and R4, after having been partially level shifted by the first resistor R3 of the second resistive spreading ladder 44.

Comparator C3, likewise, receives comparison signals in a similar manner. The negative terminal of comparator C3 receives a comparison signal from the negative portion of the differential signal after having been level shifted by both first and second resistors R1 and R2 of the first resistive spreading ladder 34. The positive terminal of comparator C3 receives a comparison signal from the negative portion of the differential signal before being applied to either resistors R3 or R4 of the second resistive spreading ladder 44. Reference current sources 36 and 46 are connected to the ends of both the first and second resistive spreading ladders 34 and 44, respectively. Both current sources 36 and 46 are of equal value and provide a uniform and equal flow of current through each of resistive networks 34 and 44. (The quantization step size of this analog to digital conversion is simply two times the voltage developed across the resistor by the reference current source.)

The outputs of comparators C1, C2, and C3 are adapted to be coupled to a binary encoder 26 for providing an N-bit binary output code 28. As shown in FIG. 2, logic gates may be easily employed to provide for a two-bit binary output code 28. However, alternate binary encoding means such as a ROM decoder are available and are more preferable for higher bit quantizers, since the large number of logic gates required for a higher order bit quantizer results in a more complex circuit design.

The output of comparator C1 is coupled to the first input terminal of a first AND-gate 50. First AND-gate 50 having its second input terminal coupled to the output of comparator C2. The output of comparator C2 is inverted and coupled to the first input terminal of a second AND-gate 52. The second input terminal of AND-gate 52 being coupled to the output of comparator C3. The outputs of first and second AND-gates 50 and 52 are coupled to the first and second input terminals of an OR-gate 56. The output response of OR-gate 56 provides the least significant bit D0 of the binary output code 28. The output of comparator C2 is further connected to a buffer 54. The output response of buffer 54 provides the most significant bit D1 of the binary output code 28.

In operation, a differential analog input signal is applied across the positive and negative input terminals 30 and 40. Both the positive and negative portions of the differential analog input signal pass through separate buffer amplifiers 32 and 42 and resistive spreading ladders 34 and 44. Resistive spreading ladders 34 and 44 divide the incoming signal into differential comparison signals. Comparators C1, C2, and C3 compare the differential comparison signals on the first resistive spreading ladder 34 with the differential comparison signals on the second resistive spreading ladder 44. If the voltage tapped from the positive input portion of the differential analog signal is greater than the voltage tapped from the negative input portion (i.e., above the comparator threshold), the comparator provides a high output response therefrom. Likewise, if the positive input voltage portion of the differential signal is less than the negative input voltage portion (i.e., below the comparator threshold), the comparator provides a low output response. Note that when the differential input voltage is zero, that is, the positive input voltage is equal to the negative input voltage, the mid-scale comparator C2 threshold is teased. Essentially, the differential voltage levels of the comparison signals trigger the comparators in an incremental manner as the differential input signal is changed.

The outputs of comparators C1, C2, and C3 are then applied to a network of logic gates which perform the binary encoding. The binary encoding provides a two-bit binary output code. The implementation of a two-bit binary output code provides for four possible outputs. Given the 2-bit example in FIG. 2, wherein the resistors (R) and current (I) in each resistive ladder are of equal value, the four possible digital output codes for various analog input voltages ($V_{IN}$) are provided in the following logic diagram:

| Analog Input Voltage | Digital Output Code | |
|---|---|---|
| | D0 | D1 |
| $-2IR > V_{IN}$ | 0 | 0 |
| $0 > V_{IN} > -2IR$ | 0 | 1 |
| $2IR > V_{IN} > 0$ | 1 | 0 |
| $V_{IN} > 2IR$ | 1 | 1 |

A higher bit order may be implemented in order to attain higher output resolution. In doing so, a greater number of resistors and comparators are required and an alternate binary encoding means may be preferred. In all, an N-bit binary output resolution will require at least $2^n-1$ comparators and $2^n-2$ resistors for each resistive ladder, the resistors being divided equally between the buffer amplifier and the current source in each resistive spreading ladder.

In view of the foregoing, it can be appreciated that the present invention enables the user to achieve analog-to-digital conversion of a differential signal with a more simplified comparator design. Thus, while this invention has been described in connection with a particular example thereof, no limitation is intended thereby except as defined by the following claims. This is because the skilled practitioner will realize that other modifications can be made without departing from the spirit of this invention after studying the specification and drawings.

What is claimed is:

1. An analog-to-digital converter for quantizing a differential analog input signal into quantization levels and converting each level into a binary output code, said converter comprising:

first and second input means for receiving a differential analog input signal;

a first resistive network having a first plurality of resistors of equal resistance coupled in series and connected to said first input means for receiving an input signal and providing a first plurality of voltage comparison signals;

a second resistive network having a second plurality of resistors of equal resistance coupled in series and connected to said second input means for receiving an input signal and providing a second plurality of voltage comparison signals;

current source means for maintaining a constant current flow through each of said first and second resistive networks;

comparator means for comparing the first plurality of voltage comparison signals tapped from said first resistive network with said second plurality of voltage comparison signals tapped from said second resistive network, said comparator means including a plurality of comparators, each comparator receiving a pair of voltage signals and providing an output therefrom; and binary encoding means coupled to said comparator outputs for providing an N-bit binary output code response.

2. The converter as defined in claim 1 wherein said current source means comprises:

a first current source connected in series with said first plurality of resistors of the first resistive network; and a second current source connected in series with said second plurality of resistors of the second resistive network, said first and second current sources providing substantially equal amounts of current flow in said first and second resistive networks.

3. The converter as defined in claim 2 further comprising:

first buffer means coupled between said first input means and said first resistive network; and second buffer means coupled between said second input means and said second resistive network.

4. The converter as defined in claim 3 wherein said pair of voltage signals received by each comparator comprises one of said first plurality of voltage comparison signals and one of said second plurality of voltage comparison signals.

5. The converter as defined in claim 4 wherein each of said first and second plurality of voltage comparison signals are tapped from said first and second resistive networks, the first voltage comparison signal from each network being tapped between said input means and the first resistor, each of said remaining voltage comparison signals being tapped following each successive serially connected resistor.

6. The converter as defined in claim 5 wherein the first of said plurality of comparators receives the first voltage comparison signal tapped from said first resistive network and the last voltage comparator signal tapped from said second resistive network, each of the remaining successive comparators receiving the next voltage comparison signals from said first resistive network in successive descending order and the next voltage comparison signals from said second resistive network in successive ascending order.

7. The converter as defined in claim 4 wherein the first and second resistive networks each comprise two resistors, each network providing three voltage comparison signals, the first comparison signal being tapped prior to the first resistor, the second comparison signal being tapped between the two resistors, and the third comparison signal being tapped after both resistors.

8. The converter of claim 7 wherein the comparator means comprises a first, second, and third comparator, said first comparator receiving said first voltage comparison signal tapped from said first resistive network with said third voltage comparison signal tapped from said second resistive network, the second comparator receiving the second voltage comparison signals from both resistive networks, and the third comparator receiving said third voltage comparison signal tapped from said first resistive network with said first voltage comparison signal tapped from said second resistive network.

9. The converter as defined in claim 1 wherein said binary encoding means comprises logic gates coupled to the outputs of said comparators and adapted to provide a two-bit binary output code.

10. The converter as defined in claim 1 wherein said plurality of comparators comprises at least $2^n - 1$ comparators for said N-bit binary output code response.

11. The converter as defined in claim 10 wherein said plurality of resistors of first and second resistive networks are equal in value and each network comprises at least $2^n - 2$ resistors.

12. In an analog-to-digital converter for converting a differential analog input signal to a plurality of digitized output signals including a first and second input means for receiving a differential analog input signal, comparison means for comparing a plurality of differential input signals, and binary encoding means for providing an n-bit binary output code, a resistive spreading means for spreading the differential analog inputs, said resistive spreading means comprising:

a first resistive network having a first plurality of resistors of equal resistance connected in series and connected to said first input means and a first reference current source, said first resistive network providing a first plurality of comparison signals therein;

a second resistive network having a second plurality of resistors of equal resistance connected in series and connected to said second input means and a second reference current source, said second resistive network providing a second plurality of comparison signals therein; and wherein said comparator means includes a plurality of comparators, each comparator receiving a voltage signal from said first plurality of comparison signals and a voltage signal from said second plurality of comparison signals and producing an output signal therefrom, each of said comparator output signals being provided to the binary encoding means.

13. The resistive spreading means as defined in claim 12 further comprising a first buffer means coupled between said first input means and first resistive network and a second buffer means coupled between said second input means and said second resistive network.

14. The resistive spreading means as defined in claim 12 wherein said plurality of resistors of each of said first and second resistive networks comprises at least $2^n - 2$ resistors for each network.

15. The resistive spreading means as defined in claim 14 wherein said plurality of comparators comprises at least $2^n - 1$ comparators.

16. The resistive spreading means as defined in claim 12 wherein said comparators compare selected pairs of voltage signals, said selected pairs of voltage signals comprising the first voltage comparison signal tapped from said first resistive network matched with the last voltage comparison signal tapped from said second resistive network, and each of the next voltage comparison signals tapped from said first resistive network in successive descending order respectively matched with the next voltage comparison signals tapped from said second resistive network in successive ascending order.

17. An analog-to-digital conversion method for quantizing a differential analog input signal into quantization levels and converting each level into a binary output code, said method comprising:
   receiving the positive and negative portions of a differential analog input signal;
   spreading the negative portion of the differential analog signal with the use of a first plurality of serially connected even valued resistors to provide a first plurality of voltage comparison signals therein;
   spreading the positive portion of the differential analog signal with the use of a second plurality of serially connected even valued resistors to provide a second plurality of voltage comparison signals therein;
   providing for a uniform current flow through each resistor;
   comparing said first plurality of voltage comparison signals with said second plurality of voltage comparison signals, said comparison performed by a plurality of comparators each requiring two inputs; and
   encoding the outputs of said comparators to provide an N-bit binary output code.

18. The method as defined in claim 17 further comprising buffering said positive and negative portions of the differential analog input signal.

19. The method as defined in claim 17 wherein said step of comparing said first and second voltage comparison signals further comprises the steps of:
   selecting spread signals from said first plurality of voltage comparison signals in successive ascending order;
   selecting spread signals from said second plurality of voltage comparison signals in successive descending order; and
   comparing pairs of selected spread signals with said comparitors.

* * * * *